United States Patent [19]

Bean et al.

[11] Patent Number: 4,599,247
[45] Date of Patent: Jul. 8, 1986

[54] SEMICONDUCTOR PROCESSING FACILITY FOR PROVIDING ENHANCED OXIDATION RATE

[75] Inventors: Kenneth E. Bean, Richardson; Robert H. Havemann, Garland; Andrew Lane, Westminster, all of Tex.

[73] Assignee: Texas Instruments Incorporated, Dallas, Tex.

[21] Appl. No.: 688,771

[22] Filed: Jan. 4, 1985

[51] Int. Cl.⁴ .......................... B05D 5/12; C23C 16/00
[52] U.S. Cl. ..................................... 427/93; 427/255.1; 427/255.3; 427/255.4; 427/314; 427/315
[58] Field of Search .................. 427/93, 255.4, 315, 427/314, 255.1, 255.3

[56] References Cited
U.S. PATENT DOCUMENTS 4,232,057 11/1980 Ray et al. ........................... 427/39
4,268,538 5/1981 Toole et al. ...................... 427/255.3

Primary Examiner—Thurman K. Page
Attorney, Agent, or Firm—Robert Groover, III; James T. Comfort; Melvin Sharp

[57] ABSTRACT

The disclosure relates to a method of growing thermal oxide on silicon wherein the oxide is grown at an increased rate, at reduced temperature or a combination thereof. This is accomplished by operating in an hermetic quartz tube capable of withstanding high pressure with steam or oxygen at super atmospheric pressure.

19 Claims, 2 Drawing Figures

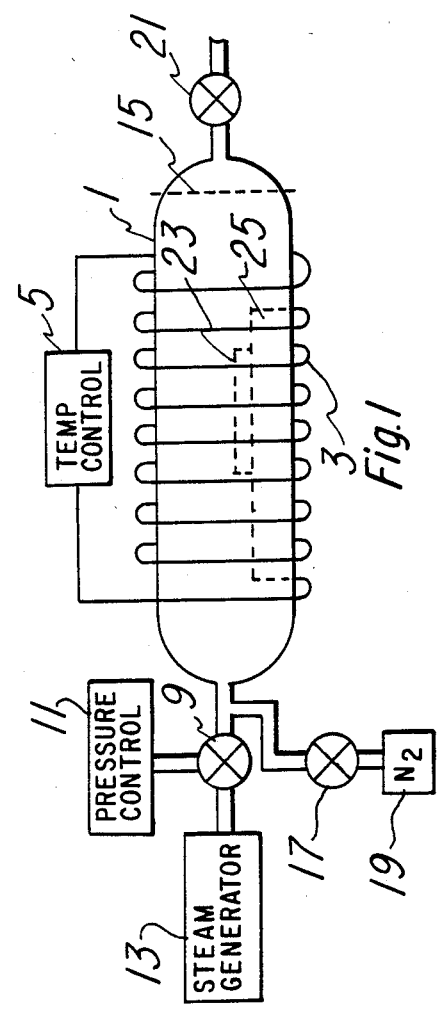
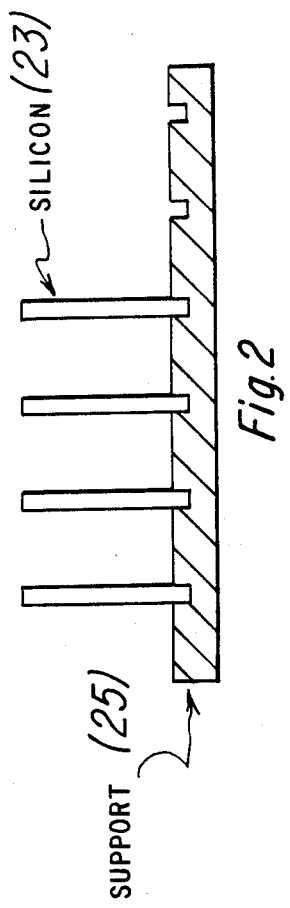

SEMICONDUCTOR PROCESSING FACILITY FOR PROVIDING ENHANCED OXIDATION RATE

BACKGROUND OF THE INVENTION

1. Field of the Invention

This invention relates to a semiconductor processing facility for providing increased oxidation rates under standard conditions or for providing existing oxidation rates at reduced temperatures.

2. Description of the Prior Art

The procedure of thermally growing oxides on silicon is an important processing step in the manufacture of silicon semiconductor devices and several systems are known for performing such functions. One prior art system is composed of a quartz tube with open ends with a resistive heat element disposed about the quartz tube. In this prior art system, oxygen or steam is flowed through the open quartz tube whereby heated silicon members within the tube are oxidized to form the thermally grown oxide on the surface thereof. Quartz tubes of this type can be used in either a batch or continuous process. Oxidation takes place at ambient pressures which are essentially atmospheric.

The major limitation of this prior art system is the amount of time at elevated temperatures (typically 900° to 1000° C.) that is required to grow thermal oxides. For example, a 1 $\mu$m thick field oxide would require approximately 4 hours to grow at 1000° C., and approximately 12 hours to grow at 900° C. in steam. While these thermal cycles are tolerated, it is known that both the time and temperature of oxidation processes must in general be minimized to optimize the yield and quality of finished semiconductor devices. In addition, oxidation time must also be minimized to increase manufacturing throughput and improve the efficiency of overall energy use in oxidation furnaces.

For these reasons, oxidations at elevated pressures have been explored, since it is known that the oxidation rate of silicon can be increased by operating at elevated pressure or, alternatively, the generating temperature required to achieve a given growth rate can be lowered if the pressure is elevated. In general, the oxidation time at a given temperature is inversely proportional to pressure; the oxidation temperature may also be reduced by approximately 30° C. for each atmosphere of pressure increase while maintaining a given oxidation rate. For example, a 1 $\mu$m thick field oxide grown at 900° C. in steam would require only ~2.5 hours of oxidation time at 5 atmospheres and only ~1.25 hours of oxidation time at 10 atmospheres of pressure.

Experiments in oxide growth on silicon at elevated pressures have been carried out using a second prior art system which comprises a thin quartz tube with a surrounding metal jacket to provide support for the quartz tube and also to seal the quartz tube from the external environment, and a resistive heater around the quartz tube between the tube and the jacket. In this prior art system the pressure within the quartz tube and external to the tube between the tube and the steel jacket are approximately equal. This system therefore suffers the problem that contamination from the metal jacket travels into the quartz tube and presents contaminants to the silicon devices upon which fabrication steps are being performed. In this system, the metal jacket with the quartz tube inside is sealed and steam or oxygen in a nitrogen ambient is passed into the enclosure to a pressure of up to 25 atmospheres. The steam or other ambient passes through the open ends of the quartz tube so that the pressure on both sides of the quartz tube can be approximately the same. For this reason a thick quartz tube is not required. However, this high pressure system occupies a much larger space than oxidation furnaces operating at atmospheric pressures.

Accordingly, it is desired to provide a system for thermally oxidizing silicon which is capable of withstanding the higher pressures encountered to permit operation with decreased temperature and/or decreased time requirements, which is capable of continuous operation and which maintains the area wherein oxidation takes place substantially free of contaminants. Furthermore, the system should be capable of being fitted into a conventional atmospheric furnace enclosure, thereby substantially decreasing the amount of floor space required and hence minimizing cost.

SUMMARY OF THE INVENTION

In accordance with the present invention, there is provided a system for growing thermal oxide on silicon which is capable of operating at controlled temperature and pressure including very high pressure of 10 atmospheres and greater and wherein contaminants are substantially eliminated from the system during oxidation. The system is also capable of being retrofitted into a standard furnace enclosure. Briefly, the above is accomplished by providing a sealed quartz tube which is hermetic to the gases therein and capable of withstanding pressures substantially above atmospheric pressure. The quartz tube has a standard, diffusion furnace-type resistive heater therearound for heating the content therein and a controller which is responsive to a transducer for measuring temperature within the tube to control the resistive heater and thereby control temperature within the tube. The quartz tube includes valves at opposite ends thereof, one of the valves being controlled by a pressure controller and being coupled to an oxygen source. The quartz tube includes an hermetically sealed door which can be opened for the entry therein of silicon devices for operation thereon. The quartz tube is formed from a type of quartz and with a sufficient thickness to withstand the pressures which will be utilized for growth of thermal oxides therein. Other materials such as high purity polycrystalline silicon or silicon carbide could also be used.

In actual operation, the furnace is preheated and stabilized at the required oxidation temperature, one or more slices are placed in the quartz tube and the door is hermetically sealed. The valves are then opened and an inert gas, such as helium or argon, is passed through the quartz tube to out-gas the tube. The valve to the high pressure stainless steel steam generator is then opened and the pressure in the quartz tube is allowed to slowly reach that required in the particular process. The temperature and pressure are maintained for the time required to grow the desired thickness of oxide. The pressure in the tube is dropped to atmospheric pressure and then the door is opened to permit slow removal of the oxidized silicon members.

BRIEF DESCRIPTION OF THE DRAWINGS

FIG. 1 is a schematic diagram of a quartz tube system for thermally oxidizing silicon in accordance with the present invention; and FIG. 2 is a cross-sectional view of silicon wafers 23 mounted on a support 25 for placement within tube 1.

DESCRIPTION OF THE PREFERRED EMBODIMENTS

Referring now to FIG. 1, there is shown a system for thermally oxidizing silicon in accordance with the present invention. The system includes a sealed quartz tube 1 which is hermetic to the gases therein and capable of withstanding pressures substantially above atmospheric pressure. The quartz tube has the standard resistive heater 3 therearound for heating the silicon wafer 23 on support 25, also shown in FIG. 2, within the tube and a controller 5 which is responsive to a transducer (not shown) of standard type for measuring temperature within the tube 1 to control the resistive heater 3 and thereby control the temperature within the tube. The quartz tube 1 includes valves 9 and 21 at opposite ends thereof, the valve 9 being controlled by a pressure controller 11 and being coupled to an oxygen source 13 which, in this case, is shown as a steam generator. The quartz tube 1 includes an hermetically sealed door 15 shown in dotted lines in FIG. 1 which can be opened for the entry therein of silicon devices 23 for operation thereon. The quartz tube 1 is formed from a type of quartz and with a sufficient thickness to withstand the pressures which will be utilized for growth of thermal oxides therein. A nitrogen gas source 19 is also provided to purge the tube 1 through valve 17.

In actual operation, a silicon slice 23 is placed in the quartz tube 1, the valves 21 and 17 are then opened and nitrogen from the nitrogen source 19 is passed through the quartz tube and through the open valve 21 to outgas the tube. The tube can be optionally pumped down to a vacuum by pumping equipment (not shown) at closing valve 21. The valve 21 is closed and the heater 3 is then operated to heat the interior of the tube 1 to the required temperature for oxidation. The valve 9 is opened when this temperature has been reached and steam from the steam generator 13 is then passed into the tube 1 by means of a pump, if necessary, until the desired pressure in the tube has been reached as determined by the pressure control 11. The temperature and pressure are maintained in the tube 1 for the required time and then the heater 3 is turned off and the interior of the tube is permitted to cool with the pressure being maintained. When the temperature has dropped sufficiently to avoid reaction with external contaminants the pressure in the tube 1 is dropped to atmospheric pressure by opening the valve 21 and closing the valve 9. When atmospheric pressure has been reached, the door 15 is opened and the oxidized silicon members are removed from the tube 1. Preferred temperatures of operation in the tube 1 are above 650° C. prior to entry of the steam with the temperature rising to 700° C. to 900° C. at a pressure of 1 to 10 atmospheres.

The steam generator 13 can be replaced by dripping of water into the cell 1 after the 650° C. or other appropriate temperature has been reached with the water turning to steam and causing a pressure increase, the water continually being trickled in and turning to steam until the desired pressure has been reached. A further alternative to the steam generator is the introduction of semiconductor quality hydrogen and oxygen which form water which turns to steam within the tube 1 with continual addition of these gases until the desired pressure has been reached. This avoids the possibility of contaminants entering the system during the oxidation process.

A further alternative is the use of electronic grade oxygen from a cylinder which provides both the oxidation source and the required pressure.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:
1. A method of thermally oxidizing a silicon member comprising:
   (a) providing an hermetic quartz tube capable of withstanding pressures therein of from 1 to about 20 atmospheres, as the only pressurized vessel,
   (b) placing a semiconductor member in said tube;
   (c) out-gassing and sealing said tube;
   (d) heating the interior of said tube to a predetermined temperature above the boiling point of steam therein at a predetermined super atmospheric pressure while maintaining the exterior of said tube at atmospheric pressure;
   (e) placing steam in said tube at said super atmospheric pressure after said boiling point temperature has been reached;
   (f) maintaining said predetermined pressure and predetermined temperature in said tube for a predetermined time period;
   (g) cooling the interior of said tube; and
   (h) lowering the pressure in said tube.
2. A method as set forth in claim 1 wherein step (e) comprises the step of injecting steam into said tube.
3. A method as set forth in claim 1 wherein step (e) comprises the step of dripping water into said tube.
4. A method as set forth in claim 1 wherein step (e) comprises the step of injecting hydrogen gas and oxygen gas into said tube.
5. A method as set forth in claim 1 wherein said predetermined pressure is in the range of about 3 to about 10 atmospheres.
6. A method as set forth in claim 2 wherein said predetermined pressure is in the range of about 3 to about 10 atmospheres.
7. A method as set forth in claim 3 wherein said predetermined pressure is in the range of about 3 to about 10 atmospheres.
8. A method as set forth in claim 4 wherein said predetermined pressure is in the range of about 3 to about 10 atmospheres.
9. A method as set forth in claim 1 wherein said predetermined temperature is about 1000° C.-30° times the pressure in atmosphere in said tube.
10. A method as set forth in claim 2 wherein said predetermined temperature is about 1000° C.-30° times the pressure in atmosphere in said tube.
11. A method as set forth in claim 3 wherein said predetermined temperature is about 1000° C.-30° times the pressure in atmosphere in said tube.
12. A method as set forth in claim 4 wherein said predetermined temperature is about 1000° C.-30° times the pressure in atmosphere in said tube.
13. A method as set forth in claim 5 wherein said predetermined temperature is about 1000° C.-30° times the pressure in atmosphere in said tube.
14. A method as set forth in claim 6 wherein said predetermined temperature is about 1000° C.-30° times the pressure in atmosphere in said tube.

15. A method as set forth in claim 7 wherein said predetermined temperature is about 1000° C.–30° times the pressure in atmosphere in said tube.

16. A method as set forth in claim 8 wherein said predetermined temperature is about 1000° C.–30° times the pressure in atmosphere in said tube.

17. A method as set forth in claim 1 wherein said quartz tube is designed to support said internal pressure with a safety factor of ten times.

18. A method as set forth in claim 1 further including providing an all quartz system within said quartz tube.

19. A method as set forth in claim 1 further including providing a system within said tube all formed from material taken from the class consisting of quartz, silicon carbide, silicon and combinations thereof.

* * * * *